US010579474B2

(12) United States Patent
Davis et al.

(10) Patent No.: US 10,579,474 B2
(45) Date of Patent: *Mar. 3, 2020

(54) DIE-LEVEL MONITORING IN A STORAGE CLUSTER

(71) Applicant: PURE STORAGE, INC., Mountain View, CA (US)

(72) Inventors: John D. Davis, San Francisco, CA (US); John Hayes, Mountain View, CA (US); Hari Kannan, Sunnyvale, CA (US); Nenad Miladinovic, Campbell, CA (US); Zhangxi Tan, Mountain View, CA (US)

(73) Assignee: Pure Storage, Inc., Mountain View, CA (US)

( * ) Notice: Subject to any disclaimer, the term of this patent is extended or adjusted under 35 U.S.C. 154(b) by 74 days.

This patent is subject to a terminal disclaimer.

(21) Appl. No.: 15/882,886

(22) Filed: Jan. 29, 2018

(65) Prior Publication Data

US 2018/0165154 A1   Jun. 14, 2018

Related U.S. Application Data

(60) Division of application No. 14/712,756, filed on May 14, 2015, now Pat. No. 9,880,899, which is a
(Continued)

(51) Int. Cl.
*G06F 11/10* (2006.01)
*G11C 29/52* (2006.01)
(Continued)

(52) U.S. Cl.
CPC ........ *G06F 11/1068* (2013.01); *G06F 11/076* (2013.01); *G06F 11/1048* (2013.01);
(Continued)

(58) Field of Classification Search
CPC ............... G06F 11/1068; G06F 11/076; G06F 11/1048; G06F 17/30194;
(Continued)

(56) References Cited

U.S. PATENT DOCUMENTS 5,390,327 A    2/1995  Lubbers et al.
5,479,653 A   12/1995  Jones
(Continued)

FOREIGN PATENT DOCUMENTS

EP    2164006    3/2010
EP    2256621   12/2010
(Continued)

OTHER PUBLICATIONS

Hwang, Kai, et al. "RAID-x: A New Distributed Disk Array for I/O-Centric Cluster Computing," HPDC '00 Proceedings of the 9th IEEE International Symposium on High Performance Distributed Computing, IEEE, 2000, pp. 279-286.
(Continued)

*Primary Examiner* — Cynthia Britt
(74) *Attorney, Agent, or Firm* — Womble Bond Dickinson (US) LLP

(57) ABSTRACT

In some embodiments, a method for die-level monitoring is provided. The method includes distributing user data throughout a plurality of storage nodes through erasure coding, wherein the plurality of storage nodes are housed within a chassis that couples the storage nodes. Each of the storage nodes has a non-volatile solid-state storage with non-volatile memory and the user data is accessible via the erasure coding from a remainder of the storage nodes in event of two of the storage nodes being unreachable. The method includes producing diagnostic information that diagnoses the non-volatile memory on a basis of per package, per die, per plane, per block, or per page, the producing per-
(Continued)

formed by each of the plurality of storage nodes. The method includes writing the diagnostic information to a memory in the storage cluster.

12 Claims, 8 Drawing Sheets

Related U.S. Application Data continuation of application No. 14/454,522, filed on Aug. 7, 2014, now Pat. No. 9,082,512.

(51) Int. Cl.
*G06F 16/182* (2019.01)
*G11C 16/34* (2006.01)
*G06F 11/07* (2006.01)
*G11C 29/44* (2006.01)
*G06F 12/02* (2006.01)
*G11C 29/04* (2006.01)

(52) U.S. Cl.
CPC .......... *G06F 16/182* (2019.01); *G11C 16/349* (2013.01); *G11C 29/44* (2013.01); *G11C 29/52* (2013.01); *G06F 12/0246* (2013.01); *G06F 16/1827* (2019.01); *G06F 2212/7207* (2013.01); *G06F 2212/7208* (2013.01); *G06F 2212/7211* (2013.01); *G11C 2029/0409* (2013.01); *G11C 2029/0411* (2013.01)

(58) Field of Classification Search
CPC ..... G06F 2212/7211; G06F 2212/7208; G06F 16/182; G06F 16/1827; G06F 17/302; G06F 12/0246; G06F 2212/7207; G11C 29/44; G11C 16/349; G11C 29/52; G11C 2029/0409; G11C 2029/0411
See application file for complete search history.

(56) References Cited

U.S. PATENT DOCUMENTS

| | | |
|---|---|---|
| 5,649,093 A | 7/1997 | Hanko et al. |
| 6,275,898 B1 | 8/2001 | DeKoning |
| 6,535,417 B2 | 3/2003 | Tsuda |
| 6,643,748 B1 | 11/2003 | Wieland |
| 6,725,392 B1 | 4/2004 | Frey et al. |
| 6,836,816 B2 | 12/2004 | Kendall |
| 6,985,995 B2 | 1/2006 | Holland et al. |
| 7,032,125 B2 | 4/2006 | Holt et al. |
| 7,051,155 B2 | 5/2006 | Talagala et al. |
| 7,065,617 B2 | 6/2006 | Wang |
| 7,069,383 B2 | 6/2006 | Yamamoto et al. |
| 7,076,606 B2 | 7/2006 | Orsley |
| 7,107,480 B1 | 9/2006 | Moshayedi et al. |
| 7,159,150 B2 | 1/2007 | Kenchammana-Hosekote et al. |
| 7,162,575 B2 | 1/2007 | Dalal et al. |
| 7,164,608 B2 | 1/2007 | Lee |
| 7,334,156 B2 | 2/2008 | Land et al. |
| 7,370,220 B1 | 5/2008 | Nguyen et al. |
| 7,424,498 B1 | 9/2008 | Patterson |
| 7,424,592 B1 | 9/2008 | Karr |
| 7,444,532 B2 | 10/2008 | Masuyama et al. |
| 7,480,658 B2 | 1/2009 | Heinla et al. |
| 7,536,506 B2 | 5/2009 | Ashmore et al. |
| 7,558,859 B2 | 7/2009 | Kasiolas |
| 7,565,446 B2 | 7/2009 | Talagala et al. |
| 7,613,947 B1 | 11/2009 | Coatney |
| 7,681,104 B1 | 3/2010 | Sim-Tang et al. |
| 7,681,105 B1 | 3/2010 | Sim-Tang et al. |
| 7,730,258 B1 | 6/2010 | Smith |
| 7,743,276 B2 | 6/2010 | Jacobsen et al. |
| 7,757,038 B2 | 7/2010 | Kitahara |
| 7,778,960 B1 | 8/2010 | Chatterjee et al. |
| 7,814,272 B2 | 10/2010 | Barrall et al. |
| 7,814,273 B2 | 10/2010 | Barrall |
| 7,818,531 B2 | 10/2010 | Barrall |
| 7,827,351 B2 | 11/2010 | Suetsugu et al. |
| 7,827,439 B2 | 11/2010 | Matthew et al. |
| 7,870,105 B2 | 1/2011 | Arakawa et al. |
| 7,885,938 B1 | 2/2011 | Greene et al. |
| 7,886,111 B2 | 2/2011 | Klemm et al. |
| 7,908,448 B1 | 3/2011 | Chatterjee et al. |
| 7,916,538 B2 | 3/2011 | Jeon et al. |
| 7,941,697 B2 | 5/2011 | Mathew et al. |
| 7,958,303 B2 | 6/2011 | Shuster |
| 7,971,129 B2 | 6/2011 | Watson |
| 7,991,822 B2 | 8/2011 | Bish et al. |
| 8,010,485 B1 | 8/2011 | Chatterjee et al. |
| 8,010,829 B1 | 8/2011 | Chatterjee et al. |
| 8,020,047 B2 | 9/2011 | Courtney |
| 8,046,548 B1 | 10/2011 | Chatterjee et al. |
| 8,051,361 B2 | 11/2011 | Sim-Tang et al. |
| 8,051,362 B2 | 11/2011 | Li et al. |
| 8,082,393 B2 | 12/2011 | Galloway et al. |
| 8,086,634 B2 | 12/2011 | Mimatsu |
| 8,086,911 B1 | 12/2011 | Taylor |
| 8,090,837 B2 | 1/2012 | Shin et al. |
| 8,108,502 B2 | 1/2012 | Tabbara et al. |
| 8,117,388 B2 | 2/2012 | Jernigan, IV |
| 8,140,821 B1 | 3/2012 | Raizen et al. |
| 8,145,838 B1 | 3/2012 | Miller et al. |
| 8,145,840 B2 | 3/2012 | Koul et al. |
| 8,176,360 B2 | 5/2012 | Frost et al. |
| 8,180,855 B2 | 5/2012 | Aiello et al. |
| 8,200,922 B2 | 6/2012 | McKean et al. |
| 8,225,006 B1 | 7/2012 | Karamcheti |
| 8,239,618 B2 | 8/2012 | Kotzur et al. |
| 8,244,999 B1 | 8/2012 | Chatterjee et al. |
| 8,305,811 B2 | 11/2012 | Jeon |
| 8,315,999 B2 | 11/2012 | Chatley et al. |
| 8,327,080 B1 | 12/2012 | Der |
| 8,351,290 B1 | 1/2013 | Huang et al. |
| 8,375,146 B2 | 2/2013 | Sinclair |
| 8,397,016 B2 | 3/2013 | Talagala et al. |
| 8,402,152 B2 | 3/2013 | Duran |
| 8,412,880 B2 | 4/2013 | Leibowitz et al. |
| 8,423,739 B2 | 4/2013 | Ash et al. |
| 8,429,436 B2 | 4/2013 | Filingim et al. |
| 8,473,778 B2 | 6/2013 | Simitci |
| 8,479,037 B1 | 7/2013 | Chatterjee et al. |
| 8,498,967 B1 | 7/2013 | Chatterjee et al. |
| 8,522,073 B2 | 8/2013 | Cohen |
| 8,533,527 B2 | 9/2013 | Daikokuya et al. |
| 8,544,029 B2 | 9/2013 | Bakke et al. |
| 8,589,625 B2 | 11/2013 | Colgrove et al. |
| 8,595,455 B2 | 11/2013 | Chatterjee et al. |
| 8,615,599 B1 | 12/2013 | Takefman et al. |
| 8,627,136 B2 | 1/2014 | Shankar et al. |
| 8,627,138 B1 | 1/2014 | Clark |
| 8,660,131 B2 | 2/2014 | Vermunt et al. |
| 8,661,218 B1 | 2/2014 | Piszczek et al. |
| 8,700,875 B1 | 4/2014 | Barron et al. |
| 8,706,694 B2 | 4/2014 | Chatterjee et al. |
| 8,706,914 B2 | 4/2014 | Duchesneau |
| 8,713,405 B2 | 4/2014 | Healey et al. |
| 8,725,730 B2 | 5/2014 | Keeton et al. |
| 8,756,387 B2 | 6/2014 | Frost et al. |
| 8,762,793 B2 | 6/2014 | Grube et al. |
| 8,775,858 B2 | 7/2014 | Gower et al. |
| 8,775,868 B2 | 7/2014 | Colgrove et al. |
| 8,788,913 B1 | 7/2014 | Xin et al. |
| 8,799,746 B2 | 8/2014 | Baker et al. |
| 8,819,311 B2 | 8/2014 | Liao |
| 8,819,383 B1 | 8/2014 | Jobanputra et al. |
| 8,824,261 B1 | 9/2014 | Miller et al. |
| 8,843,700 B1 | 9/2014 | Salessi et al. |
| 8,850,108 B1 | 9/2014 | Hayes et al. |
| 8,850,288 B1 | 9/2014 | Lazier et al. |
| 8,856,593 B2 | 10/2014 | Eckhardt et al. |
| 8,856,619 B1 | 10/2014 | Cypher |
| 8,862,847 B2 | 10/2014 | Feng et al. |
| 8,862,928 B2 | 10/2014 | Xavier et al. |

(56) References Cited

U.S. PATENT DOCUMENTS

| | | | |
|---|---|---|---|
| 8,868,825 B1 | 10/2014 | Hayes | |
| 8,874,836 B1 | 10/2014 | Hayes | |
| 8,886,778 B2 | 11/2014 | Nedved et al. | |
| 8,898,383 B2 | 11/2014 | Yamamoto et al. | |
| 8,898,388 B1 | 11/2014 | Kimmel | |
| 8,904,231 B2 | 12/2014 | Coatney et al. | |
| 8,918,478 B2 | 12/2014 | Ozzie et al. | |
| 8,930,307 B2 | 1/2015 | Colgrove et al. | |
| 8,930,633 B2 | 1/2015 | Amit et al. | |
| 8,949,502 B2 | 2/2015 | McKnight et al. | |
| 8,959,110 B2 | 2/2015 | Smith et al. | |
| 8,977,597 B2 | 3/2015 | Ganesh et al. | |
| 9,003,144 B1 | 4/2015 | Hayes et al. | |
| 9,009,724 B2 | 4/2015 | Gold et al. | |
| 9,021,053 B2 | 4/2015 | Bernbo et al. | |
| 9,021,215 B2 | 4/2015 | Meir et al. | |
| 9,025,393 B2 | 5/2015 | Wu | |
| 9,043,372 B2 | 5/2015 | Makkar et al. | |
| 9,053,808 B2 | 6/2015 | Sprouse | |
| 9,058,155 B2 | 6/2015 | Cepulis et al. | |
| 9,082,512 B1* | 7/2015 | Davis | G06F 11/1048 |
| 9,116,819 B2 | 8/2015 | Cope et al. | |
| 9,117,536 B2 | 8/2015 | Yoon | |
| 9,122,401 B2 | 9/2015 | Zaltsman et al. | |
| 9,134,908 B2 | 9/2015 | Horn et al. | |
| 9,153,337 B2 | 10/2015 | Sutardja | |
| 9,189,650 B2 | 11/2015 | Jaye et al. | |
| 9,201,733 B2 | 12/2015 | Verma | |
| 9,207,876 B2 | 12/2015 | Shu et al. | |
| 9,251,066 B2 | 2/2016 | Colgrove et al. | |
| 9,263,136 B1* | 2/2016 | Zhao | G11C 16/10 |
| 9,323,667 B2 | 4/2016 | Bennett | |
| 9,323,681 B2 | 4/2016 | Apostolides et al. | |
| 9,348,538 B2 | 5/2016 | Mallaiah et al. | |
| 9,384,082 B1 | 7/2016 | Lee et al. | |
| 9,390,019 B2 | 7/2016 | Patterson et al. | |
| 9,405,478 B2 | 8/2016 | Koseki et al. | |
| 9,432,541 B2 | 8/2016 | Ishida | |
| 9,454,420 B1* | 9/2016 | Tai | G06F 11/073 |
| 9,477,632 B2 | 10/2016 | Du | |
| 9,552,299 B2 | 1/2017 | Stelzer | |
| 9,965,345 B2* | 5/2018 | Liu | G06F 11/0793 |
| 2002/0144059 A1 | 10/2002 | Kendall | |
| 2003/0105984 A1 | 6/2003 | Masuyama et al. | |
| 2003/0110205 A1 | 6/2003 | Johnson | |
| 2004/0161086 A1 | 8/2004 | Buntin et al. | |
| 2005/0001652 A1 | 1/2005 | Malik et al. | |
| 2005/0076228 A1 | 4/2005 | Davis et al. | |
| 2005/0235132 A1 | 10/2005 | Karr et al. | |
| 2005/0278460 A1 | 12/2005 | Shin et al. | |
| 2005/0283649 A1 | 12/2005 | Turner et al. | |
| 2006/0015683 A1 | 1/2006 | Ashmore et al. | |
| 2006/0114930 A1 | 6/2006 | Lucas et al. | |
| 2006/0174157 A1 | 8/2006 | Barrall et al. | |
| 2006/0248294 A1 | 11/2006 | Nedved et al. | |
| 2007/0079068 A1 | 4/2007 | Draggon | |
| 2007/0214194 A1 | 9/2007 | Reuter | |
| 2007/0214314 A1 | 9/2007 | Reuter | |
| 2007/0234016 A1 | 10/2007 | Davis et al. | |
| 2007/0268905 A1 | 11/2007 | Baker et al. | |
| 2008/0080709 A1 | 4/2008 | Michtchenko et al. | |
| 2008/0107274 A1 | 5/2008 | Worthy | |
| 2008/0155191 A1 | 6/2008 | Anderson et al. | |
| 2008/0201335 A1* | 8/2008 | Dubnicki | G06F 16/10 |
| 2008/0295118 A1 | 11/2008 | Liao | |
| 2009/0077208 A1 | 3/2009 | Nguyen et al. | |
| 2009/0138654 A1 | 5/2009 | Sutardja | |
| 2009/0216910 A1 | 8/2009 | Duchesneau | |
| 2009/0216920 A1 | 8/2009 | Lauterbach et al. | |
| 2009/0319859 A1* | 12/2009 | Alrod | G06F 11/1068 |
| | | | 714/752 |
| 2010/0017444 A1 | 1/2010 | Chatterjee et al. | |
| 2010/0042636 A1 | 2/2010 | Lu | |
| 2010/0094806 A1 | 4/2010 | Apostolides et al. | |
| 2010/0115070 A1 | 5/2010 | Missimilly | |
| 2010/0125695 A1 | 5/2010 | Wu et al. | |
| 2010/0162076 A1 | 6/2010 | Sim-Tang et al. | |
| 2010/0169707 A1 | 7/2010 | Mathew et al. | |
| 2010/0174576 A1 | 7/2010 | Naylor | |
| 2010/0268908 A1 | 10/2010 | Ouyang et al. | |
| 2011/0040925 A1 | 2/2011 | Frost et al. | |
| 2011/0060927 A1 | 3/2011 | Fillingim et al. | |
| 2011/0119462 A1 | 5/2011 | Leach et al. | |
| 2011/0208996 A1* | 8/2011 | Hafner | G06F 9/466 |
| | | | 714/6.24 |
| 2011/0219170 A1 | 9/2011 | Frost et al. | |
| 2011/0238625 A1 | 9/2011 | Hamaguchi et al. | |
| 2011/0264843 A1 | 10/2011 | Haines et al. | |
| 2011/0302369 A1 | 12/2011 | Goto et al. | |
| 2012/0011398 A1 | 1/2012 | Eckhardt | |
| 2012/0079190 A1* | 3/2012 | Colgrove | G06F 11/1076 |
| | | | 711/114 |
| 2012/0079318 A1 | 3/2012 | Colgrove et al. | |
| 2012/0110249 A1 | 5/2012 | Jeong et al. | |
| 2012/0131253 A1 | 5/2012 | McKnight | |
| 2012/0158923 A1 | 6/2012 | Mohamed et al. | |
| 2012/0191900 A1 | 7/2012 | Kunimatsu et al. | |
| 2012/0198152 A1 | 8/2012 | Terry et al. | |
| 2012/0198261 A1 | 8/2012 | Brown et al. | |
| 2012/0209943 A1 | 8/2012 | Jung | |
| 2012/0226934 A1 | 9/2012 | Rao | |
| 2012/0246435 A1 | 9/2012 | Meir et al. | |
| 2012/0260055 A1 | 10/2012 | Murase | |
| 2012/0311557 A1 | 12/2012 | Resch | |
| 2013/0022201 A1 | 1/2013 | Glew et al. | |
| 2013/0036314 A1 | 2/2013 | Glew et al. | |
| 2013/0042056 A1 | 2/2013 | Shats | |
| 2013/0060884 A1 | 3/2013 | Bernbo et al. | |
| 2013/0067188 A1 | 3/2013 | Mehra et al. | |
| 2013/0073894 A1 | 3/2013 | Xavier et al. | |
| 2013/0124776 A1 | 5/2013 | Hallak et al. | |
| 2013/0132800 A1 | 5/2013 | Healey, Jr. et al. | |
| 2013/0151653 A1 | 6/2013 | Sawicki | |
| 2013/0151771 A1 | 6/2013 | Tsukahara et al. | |
| 2013/0173853 A1 | 7/2013 | Ungureanu et al. | |
| 2013/0238554 A1 | 9/2013 | Yucel et al. | |
| 2013/0339314 A1 | 12/2013 | Carpenter et al. | |
| 2013/0339635 A1 | 12/2013 | Amit et al. | |
| 2013/0339818 A1 | 12/2013 | Baker et al. | |
| 2014/0040535 A1 | 2/2014 | Lee | |
| 2014/0040702 A1 | 2/2014 | He et al. | |
| 2014/0047263 A1 | 2/2014 | Coatney et al. | |
| 2014/0047269 A1 | 2/2014 | Kim | |
| 2014/0063721 A1 | 3/2014 | Herman et al. | |
| 2014/0064048 A1 | 3/2014 | Cohen et al. | |
| 2014/0068224 A1 | 3/2014 | Fan et al. | |
| 2014/0075252 A1 | 3/2014 | Luo et al. | |
| 2014/0136880 A1 | 5/2014 | Shankar et al. | |
| 2014/0181402 A1 | 6/2014 | White | |
| 2014/0237164 A1 | 8/2014 | Le et al. | |
| 2014/0279936 A1 | 9/2014 | Bernbo et al. | |
| 2014/0280025 A1 | 9/2014 | Eidson et al. | |
| 2014/0289588 A1 | 9/2014 | Nagadomi et al. | |
| 2014/0380125 A1 | 12/2014 | Calder et al. | |
| 2014/0380126 A1 | 12/2014 | Yekhanin et al. | |
| 2015/0032720 A1 | 1/2015 | James | |
| 2015/0039645 A1 | 2/2015 | Lewis | |
| 2015/0039849 A1 | 2/2015 | Lewis | |
| 2015/0089283 A1 | 3/2015 | Kermarrec et al. | |
| 2015/0100746 A1 | 4/2015 | Rychlik | |
| 2015/0134824 A1 | 5/2015 | Mickens | |
| 2015/0153800 A1 | 6/2015 | Lucas et al. | |
| 2015/0178191 A1* | 6/2015 | Camp | G06F 12/0246 |
| | | | 711/103 |
| 2015/0180714 A1 | 6/2015 | Chunn | |
| 2015/0280959 A1 | 10/2015 | Vincent | |
| 2015/0309856 A1* | 10/2015 | Weilemann, II | G06F 11/0772 |
| | | | 714/47.3 |
| 2017/0003901 A1* | 1/2017 | Alcantara | G06F 1/3209 |

(56) References Cited

U.S. PATENT DOCUMENTS

FOREIGN PATENT DOCUMENTS

| WO | WO 02-13033 | 2/2002 |
| WO | WO 2008103569 | 8/2008 |
| WO | WO 2008157081 | 12/2008 |
| WO | WO 2013032825 | 7/2013 |

OTHER PUBLICATIONS

Schmid, Patrick: "RAID Scaling Charts, Part 3:4-128 kB Stripes Compared", Tom's Hardware, Nov. 27, 2007 (http://www.tomshardware.com/reviews/RAID-SCALING-CHARTS.1735-4.html), See pp. 1-2.
Storer, Mark W. et al., "Pergamum: Replacing Tape with Energy Efficient, Reliable, Disk-Based Archival Storage," Fast '08: 6th USENIX Conference on File and Storage Technologies, San Jose, CA, Feb. 26-29, 2008 pp. 1-16.
Ju-Kyeong Kim et al., "Data Access Frequency based Data Replication Method using Erasure Codes in Cloud Storage System", Journal of the Institute of Electronics and Information Engineers, Feb. 2014, vol. 51, No. 2, pp. 85-91.
International Search Report and the Written Opinion of the International Searching Authority, PCT/US2015/018169, dated May 15, 2015.
International Search Report and the Written Opinion of the International Searching Authority, PCT/US2015/034302, dated Sep. 11, 2015.
International Search Report and the Written Opinion of the International Searching Authority, PCT/US2015/039135, dated Sep. 18, 2015.
International Search Report and the Written Opinion of the International Searching Authority, PCT/US2015/039136, dated Sep. 23, 2015.
International Search Report, PCT/US2015/039142, dated Sep. 24, 2015.
International Search Report, PCT/US2015/034291, dated Sep. 30, 2015.
International Search Report and the Written Opinion of the International Searching Authority, PCT/US2015/039137, dated Oct. 1, 2015.
International Search Report, PCT/US2015/044370, dated Dec. 15, 2015.
International Search Report amd the Written Opinion of the International Searching Authority, PCT/US2016/031039, dated May 5, 2016.
International Search Report, PCT/US2016/014604, dated May 19, 2016.
International Search Report, PCT/US2016/014361, dated May 30, 2016.
International Search Report, PCT/US2016/014356, dated Jun. 28, 2016.
International Search Report, PCT/US2016/014357, dated Jun. 29, 2016.
International Seach Report and the Written Opinion of the International Searching Authority, PCT/US2016/016504, dated Jul. 6, 2016.
International Seach Report and the Written Opinion of the International Searching Authority, PCT/US2016/024391, dated Jul. 12, 2016.
International Seach Report and the Written Opinion of the International Searching Authority, PCT/US2016/026529, dated Jul. 19, 2016.
International Seach Report and the Written Opinion of the International Searching Authority, PCT/US2016/023485, dated Jul. 21, 2016.
International Seach Report and the Written Opinion of the International Searching Authority, PCT/US2016/033306, dated Aug. 19, 2016.
International Seach Report and the Written Opinion of the International Searching Authority, PCT/US2016/047808, dated Nov. 25, 2016.
Stalzer, Mark A., "FlashBlades: System Architecture and Applications," Proceedings of the 2nd Workshop on Architectures and Systems for Big Data, Association for Computing Machinery, New York, NY, 2012, pp. 10-14.
International Seach Report and the Written Opinion of the International Searching Authority, PCT/US2016/042147, dated Nov. 30, 2016.

\* cited by examiner

DIE-LEVEL MONITORING IN A STORAGE CLUSTER

BACKGROUND

Solid-state memory, such as flash, is currently in use in solid-state drives (SSD) to augment or replace conventional hard disk drives (HDD), writable CD (compact disk) or writable DVD (digital versatile disk) drives, collectively known as spinning media, and tape drives, for storage of large amounts of data. Flash and other solid-state memories have operation and wear characteristics that differ from spinning media. Yet, many solid-state drives are designed to conform to hard disk drive standards for compatibility reasons, which makes it difficult to provide enhanced features or take advantage of unique aspects of flash and other solid-state memory.

It is within this context that the embodiments arise.

SUMMARY

In some embodiments, a method for die-level monitoring in a storage cluster is provided. The method includes distributing user data throughout a plurality of storage nodes through erasure coding, wherein the plurality of storage nodes are housed within a chassis that couples the storage nodes as a storage cluster. Each of the plurality of storage nodes has a non-volatile solid-state storage with non-volatile memory and the user data is accessible via the erasure coding from a remainder of the plurality of storage nodes in event of two of the plurality of storage nodes being unreachable. The method includes producing diagnostic information that diagnoses the non-volatile memory of the non-volatile solid-state storage of each of the plurality of storage nodes, on a basis of per package, per die, per plane, per block, or per page, the producing performed by each of the plurality of storage nodes. The method includes writing the diagnostic information to a memory in the storage cluster, wherein a processor performs at least one method operation.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
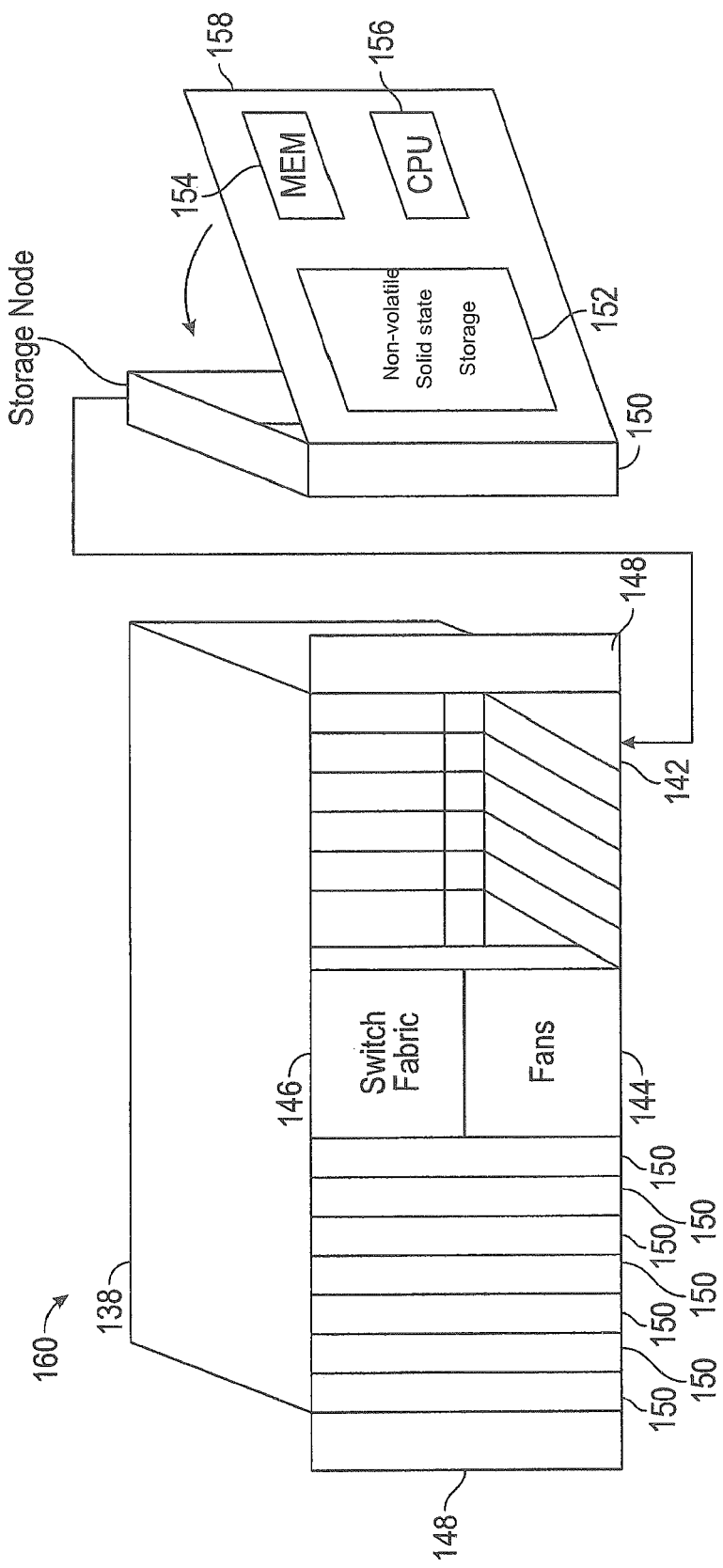
FIG. 1 is a perspective view of a storage cluster with multiple storage nodes and internal storage coupled to each storage node to provide network attached storage, in accordance with some embodiments.

The embodiments below describe a storage cluster that stores user data, such as user data originating from one or more user or client systems or other sources external to the storage cluster. The storage cluster distributes user data across storage nodes housed within a chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid-state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of the power distribution and the internal and external communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid-state memory units, which may be referred to as storage units. One embodiment includes a single storage server in each storage node and between one to eight non-volatile solid-state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid-state memory units may directly access the internal communication bus interface through a storage node communication bus, or request the storage node to access the bus interface. The non-volatile solid-state memory unit contains an embedded central processing unit (CPU), solid-state storage controller, and a quantity of solid-state mass storage, e.g., between 2-32 terabytes (TB) in some embodiments. An embedded volatile storage medium, such as DRAM, and an energy reserve apparatus are included in the non-volatile solid-state memory unit. In some embodiments, the energy reserve apparatus is a capacitor, super-capacitor, or battery that enables transferring a subset of DRAM contents to a stable storage medium in the case of power loss. In some embodiments, the non-volatile solid-state memory unit is constructed with a storage class memory, such as phase change or other resistive random access memory (RRAM) or magnetoresistive random access memory (MRAM) that substitutes for DRAM and enables a reduced power hold-up apparatus.

One of many features of the storage nodes and non-volatile solid-state storage units discussed below is the ability to track and provide diagnostic information about flash memory on a per package, die, plane, block or page basis. Flash wear, changes or trends can be tracked over time. In some embodiments, flash writes or reads can be biased, based on the diagnostic information. A flash block with a relatively high level of wear can be avoided for new writes, which are instead directed to flash blocks with lower levels of wear. These and further details of the storage memory are discussed below.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid-state storage 152 coupled to the CPU 156, although other mountings and/or components could be used in further embodiments. The memory 154 has instructions which are executed by the CPU 156 and/or data operated on by the CPU 156. As further explained below, the non-volatile solid-state storage 152 includes flash or, in further embodiments, other types of solid-state memory.

Figure 2:
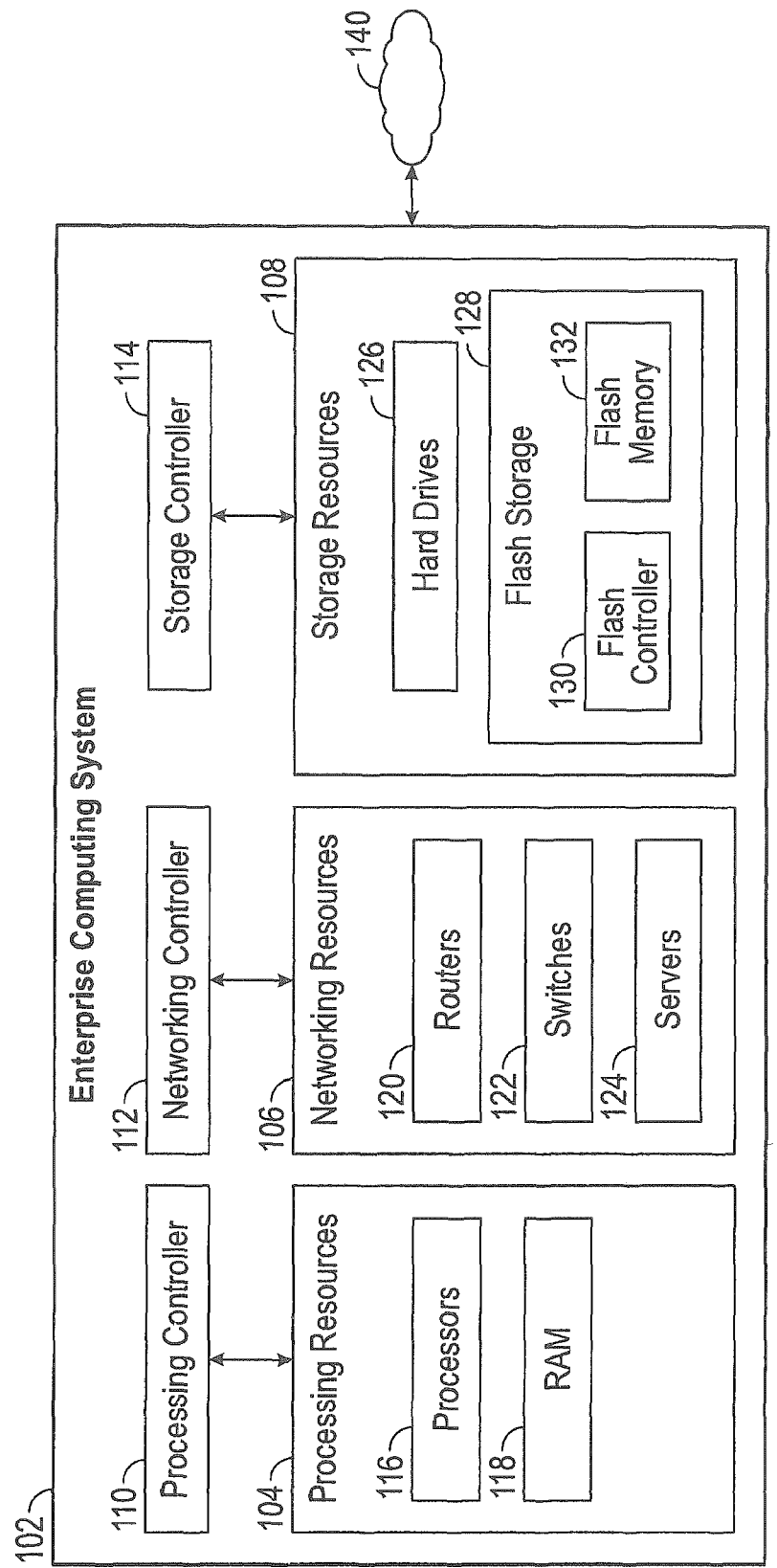
FIG. 2 is a system diagram of an enterprise computing system, which can use one or more of the storage clusters of FIG. 1 as a storage resource in some embodiments.

FIG. 2 is a system diagram of an enterprise computing system 102, which can use one or more of the storage nodes, storage clusters and/or non-volatile solid-state storage of FIG. 1 as a storage resource 108. For example, flash storage 128 of FIG. 2 may integrate the storage nodes, storage clusters and/or non-volatile solid-state storage of FIG. 1 in some embodiments. The enterprise computing system 102 has processing resources 104, networking resources 106 and storage resources 108, including flash storage 128. A flash controller 130 and flash memory 132 are included in the flash storage 128. In various embodiments, the flash storage 128 could include one or more storage nodes or storage clusters, with the flash controller 130 including the CPUs, and the flash memory 132 including the non-volatile solid-state storage of the storage nodes. In some embodiments flash memory 132 may include different types of flash memory or the same type of flash memory. The enterprise computing system 102 illustrates an environment suitable for deployment of the flash storage 128, although the flash storage 128 could be used in other computing systems or devices, larger or smaller, or in variations of the enterprise computing system 102, with fewer or additional resources. The enterprise computing system 102 can be coupled to a network 140, such as the Internet, in order to provide or make use of services. For example, the enterprise computing system 102 could provide cloud services, physical computing resources, or virtual computing services.

In the enterprise computing system 102, various resources are arranged and managed by various controllers. A processing controller 110 manages the processing resources 104, which include processors 116 and random-access memory (RAM) 118. Networking controller 112 manages the networking resources 106, which include routers 120, switches 122, and servers 124. A storage controller 114 manages storage resources 108, which include hard drives 126 and flash storage 128. Other types of processing resources, networking resources, and storage resources could be included with the embodiments. In some embodiments, the flash storage 128 completely replaces the hard drives 126. The enterprise computing system 102 can provide or allocate the various resources as physical computing resources, or in variations, as virtual computing resources supported by physical computing resources. For example, the various resources could be implemented using one or more servers executing software. Files or data objects, or other forms of data, are stored in the storage resources 108.

In various embodiments, an enterprise computing system 102 could include multiple racks populated by storage clusters, and these could be located in a single physical location such as in a cluster or a server farm. In other embodiments the multiple racks could be located at multiple physical locations such as in various cities, states or countries, connected by a network. Each of the racks, each of the storage clusters, each of the storage nodes, and each of the non-volatile solid-state storage could be individually configured with a respective amount of storage space, which is then reconfigurable independently of the others. Storage capacity can thus be flexibly added, upgraded, subtracted, recovered and/or reconfigured at each of the non-volatile solid-state storages. As mentioned previously, each storage node could implement one or more servers in some embodiments.

Figure 3:
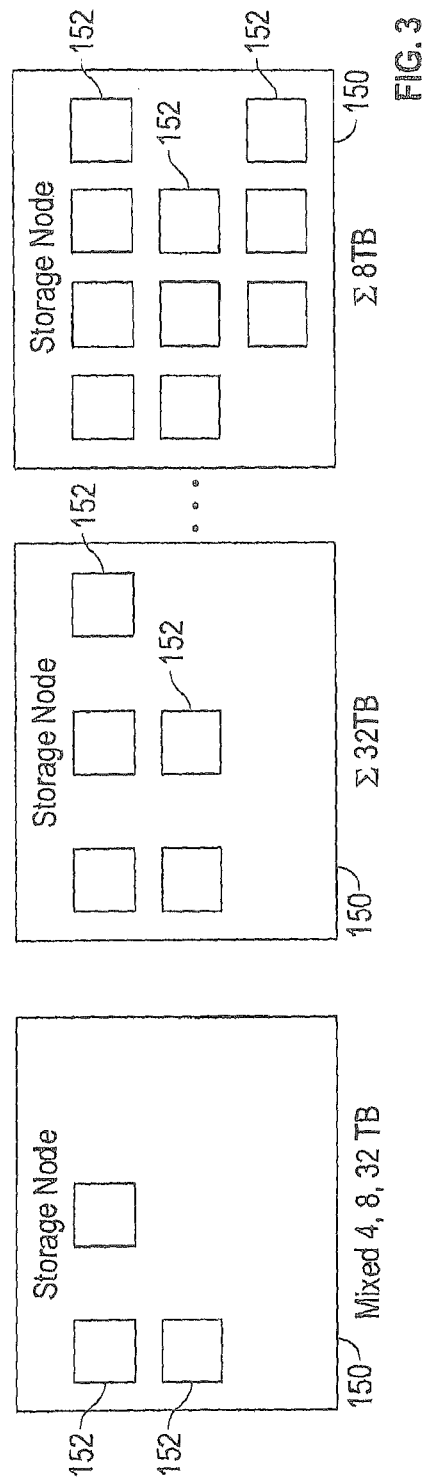
FIG. 3 is a block diagram showing multiple storage nodes and non-volatile solid-state storage with differing capacities, suitable for use in the storage cluster of FIG. 1 in accordance with some embodiments.

FIG. 3 is a block diagram showing multiple storage nodes 150 and non-volatile solid-state storage 152 with differing capacities, suitable for use in the chassis of FIG. 1. Each storage node 150 can have one or more units of non-volatile solid-state storage 152. Each non-volatile solid-state storage 152 may include differing capacity from other non-volatile solid-state storage 152 on a storage node 150 or in other storage nodes 150 in some embodiments. Alternatively, all of the non-volatile solid-state storages 152 on a storage node or on multiple storage nodes can have the same capacity or combinations of the same and/or differing capacities. This flexibility is illustrated in FIG. 3, which shows an example of one storage node 150 having mixed non-volatile solid-state storage 152 of four, eight and thirty-two TB capacity, another storage node 150 having non-volatile solid-state storage 152 each of thirty-two TB capacity, and still another storage node having non-volatile solid-state storage 152 each of eight TB capacity. Various further combinations and capacities are readily devised in accordance with the teachings herein. In the context of clustering, e.g., clustering storage to form a storage cluster, a storage node can be or include a non-volatile solid-state storage 152. Non-volatile solid-state storage 152 is a convenient clustering point as the non-volatile solid-state storage 152 may include a non-volatile random access memory (NVRAM) component, as will be further described below.

Referring to FIGS. 1 and 3, storage cluster 160 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid-state storage units 152 or storage nodes 150 within the chassis.

Figure 4:
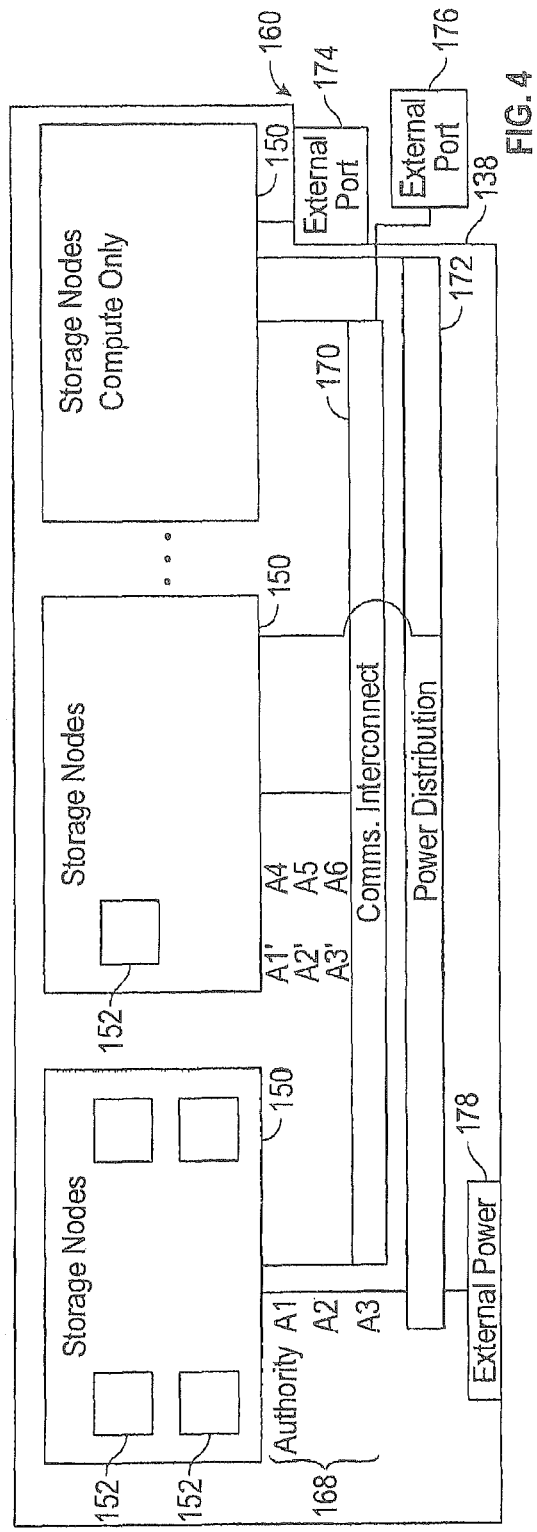
FIG. 4 is a block diagram showing an interconnect switch coupling multiple storage nodes in accordance with some embodiments.

FIG. 4 is a block diagram showing a communications interconnect 170 and power distribution bus 172 coupling multiple storage nodes 150. Referring back to FIG. 1, the communications interconnect 170 can be included in or implemented with the switch fabric 146 in some embodiments. Where multiple storage clusters 160 occupy a rack, the communications interconnect 170 can be included in or implemented with a top of rack switch, in some embodiments. As illustrated in FIG. 4, storage cluster 160 is enclosed within a single chassis 138. External port 176 is coupled to storage nodes 150 through communications interconnect 170, while external port 174 is coupled directly to a storage node. External power port 178 is coupled to power distribution bus 172. Storage nodes 150 may include varying amounts and differing capacities of non-volatile solid-state storage 152 as described with reference to FIG. 3. In addition, one or more storage nodes 150 may be a compute only storage node as illustrated in FIG. 4. Authorities 168 are implemented on the non-volatile solid-state storages 152, for example as lists or other data structures stored in memory. In some embodiments the authorities are stored within the non-volatile solid-state storage 152 and supported by software executing on a controller or other processor of the non-volatile solid-state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid-state storages 152 in some embodiments. This control assists in determining which type of erasure coding scheme is applied to the data, and which storage nodes 150 have which portions of the data. Each authority 168 may be assigned to a non-volatile solid-state storage 152. Each authority may control a range of inode numbers, segment numbers, or other data identifiers which are assigned to data by a file system, by the storage nodes 150, or by the non-volatile solid-state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid-state storage 152 in some embodiments. Each authority 168, covering a range of data segment numbers or other identifiers of the data, may be assigned to a specific non-volatile solid-state storage 152. In some embodiments the authorities 168 for all of such ranges are distributed over the non-volatile solid-state storages 152 of a storage cluster. Each storage node 150 has a network port that provides access to the non-volatile solid-state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid-state storage 152 and a local identifier into the set of non-volatile solid-state storage 152 that may contain data. In some embodiments, the local identifier is an offset into the device and may be reused sequentially by multiple segments. In other embodiments the local identifier is unique for a specific segment and never reused. The offsets in the non-volatile solid-state storage 152 are applied to locating data for writing to or reading from the non-volatile solid-state storage 152 (in the form of a RAID stripe). Data is striped across multiple units of non-volatile solid-state storage 152, which may include or be different from the non-volatile solid-state storage 152 having the authority 168 for a particular data segment.

If there is a change in where a particular segment of data is located, e.g., during a data move or a data reconstruction, the authority 168 for that data segment should be consulted, at that non-volatile solid-state storage 152 or storage node 150 having that authority 168. In order to locate a particular piece of data, embodiments calculate a hash value for a data segment or apply an inode number or a data segment number. The output of this operation points to a non-volatile solid-state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid-state storage 152, which may be done through an explicit mapping. The operation is repeatable, so that when the calculation is performed, the result of the calculation repeatably and reliably points to a particular non-volatile solid-state storage 152 having that authority 168. The operation may include the set of reachable storage nodes as input. If the set of reachable non-volatile solid-state storage units changes the optimal set changes. In some embodiments, the persisted value is the current assignment (which is always true) and the calculated value is the target assignment the cluster will attempt to reconfigure towards. This calculation may be used to determine the optimal non-volatile solid-state storage 152 for an authority in the presence of a set of non-volatile solid-state storage 152 that are reachable and constitute the same cluster. The calculation also determines an ordered set of peer non-volatile solid-state storage 152 that will also record the authority to non-volatile solid-state storage mapping so that the authority may be determined even if the assigned non-volatile solid-state storage is unreachable. A duplicate or substitute authority 168 may be consulted if a specific authority 168 is unavailable in some embodiments.

With reference to FIGS. 1-4, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid-state storage 152 currently determined to be the host of the authority 168 determined from the segment. The host CPU 156 of the storage node 150, on which the non-volatile solid-state storage 152 and corresponding authority 168 reside, then breaks up or shards the data and transmits the data out to various non-volatile solid-state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid-state storage 152 and corresponding authority 168 reside requests the data from the non-volatile solid-state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid-state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid-state storage 152 coupled to the host CPUs 156 (See FIG. 5) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top is the directory entries (file names) which link to an inode. Modes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid-state storage 152 may be assigned a range of address space. Within this assigned range, the non-volatile solid-state storage 152 is able to allocate addresses without synchronization with other non-volatile solid-state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudorandomly assigning entities to authorities, by splitting entities into ranges based upon an externally produced key, or by placing a single entity into each authority. Examples of pseudorandom schemes are linear hashing and the Replication Under Scalable Hashing (RUSH) family of hashes, including Controlled Replication Under Scalable Hashing (CRUSH). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid-state storage units that do not contain authorities. The communications interconnect between storage nodes and non-volatile solid-state storage units consists of multiple communication technologies and has non-uniform performance and fault tolerance characteristics. In some embodiments, as mentioned above, non-volatile solid-state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid-state storage unit to another non-volatile solid-state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid-state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being replicated. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 5:
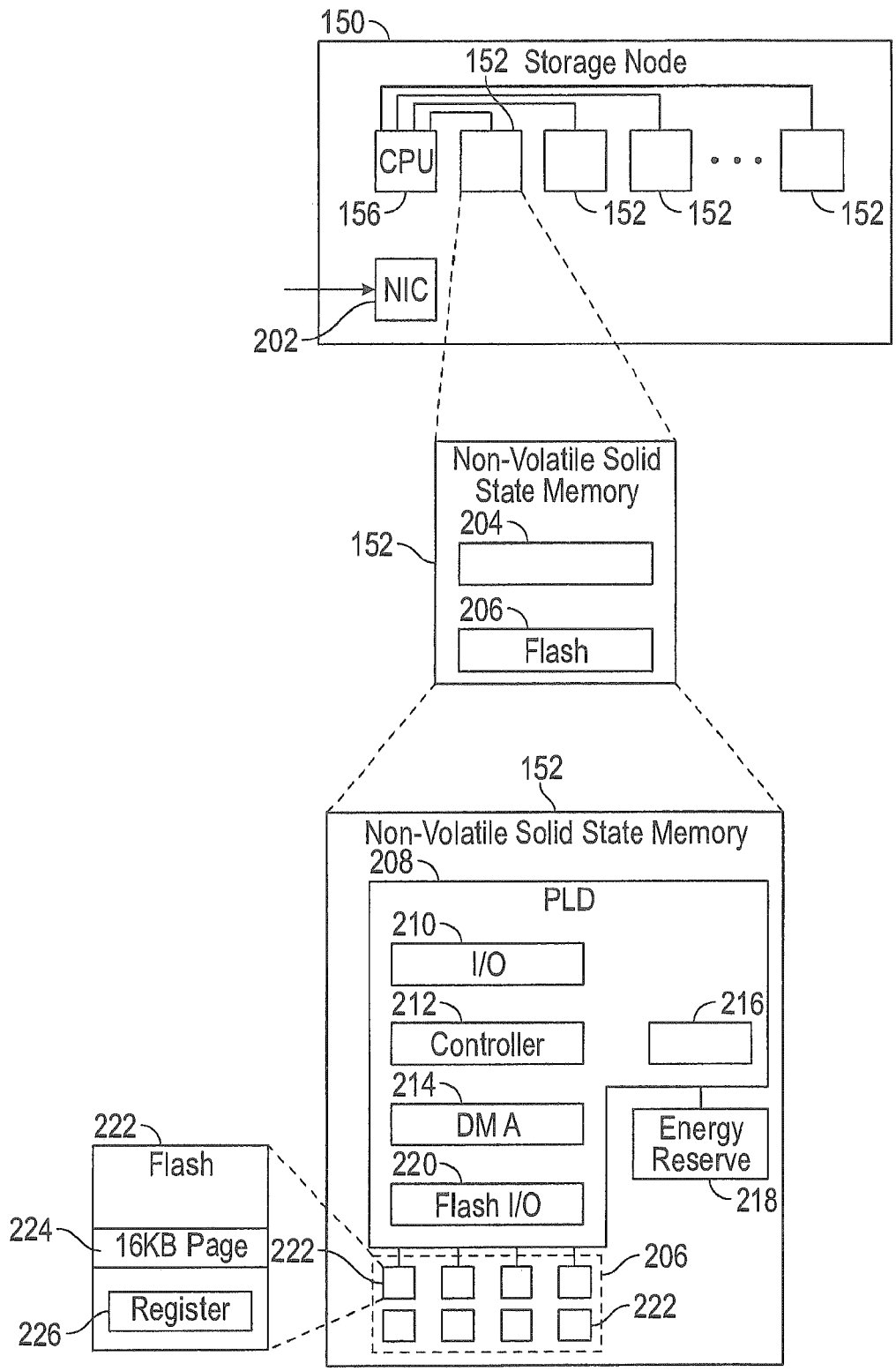
FIG. 5 is a multiple level block diagram, showing contents of a storage node and contents of one of the non-volatile solid-state storage units in accordance with some embodiments.

FIG. 5 is a multiple level block diagram, showing contents of a storage node 150 and contents of a non-volatile solid-state storage 152 of the storage node 150. Data is communicated to and from the storage node 150 by a network interface controller (NIC) 202 in some embodiments. Each storage node 150 has a CPU 156, and one or more non-volatile solid-state storage 152, as discussed above. Moving down one level in FIG. 5, each non-volatile solid-state storage 152 has a relatively fast non-volatile solid-state memory, such as non-volatile random access memory (NVRAM) 204, and flash memory 206. In some embodiments, NVRAM 204 may be a component that does not require program/erase cycles (e.g., DRAM, MRAM, or phase change memory (PCM)), and can be a memory that can support being written vastly more often than the memory is read from. Moving down another level in FIG. 5, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as dies on a printed circuit board or other substrate. In some embodiments, the hybrid package may include a combination of memory types, such as NVRAM, random access memory (RAM), CPU, field programmable gate array (FPGA), or different sized flash memory in the same package. In the embodiment shown, the non-volatile solid-state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Figure 6:
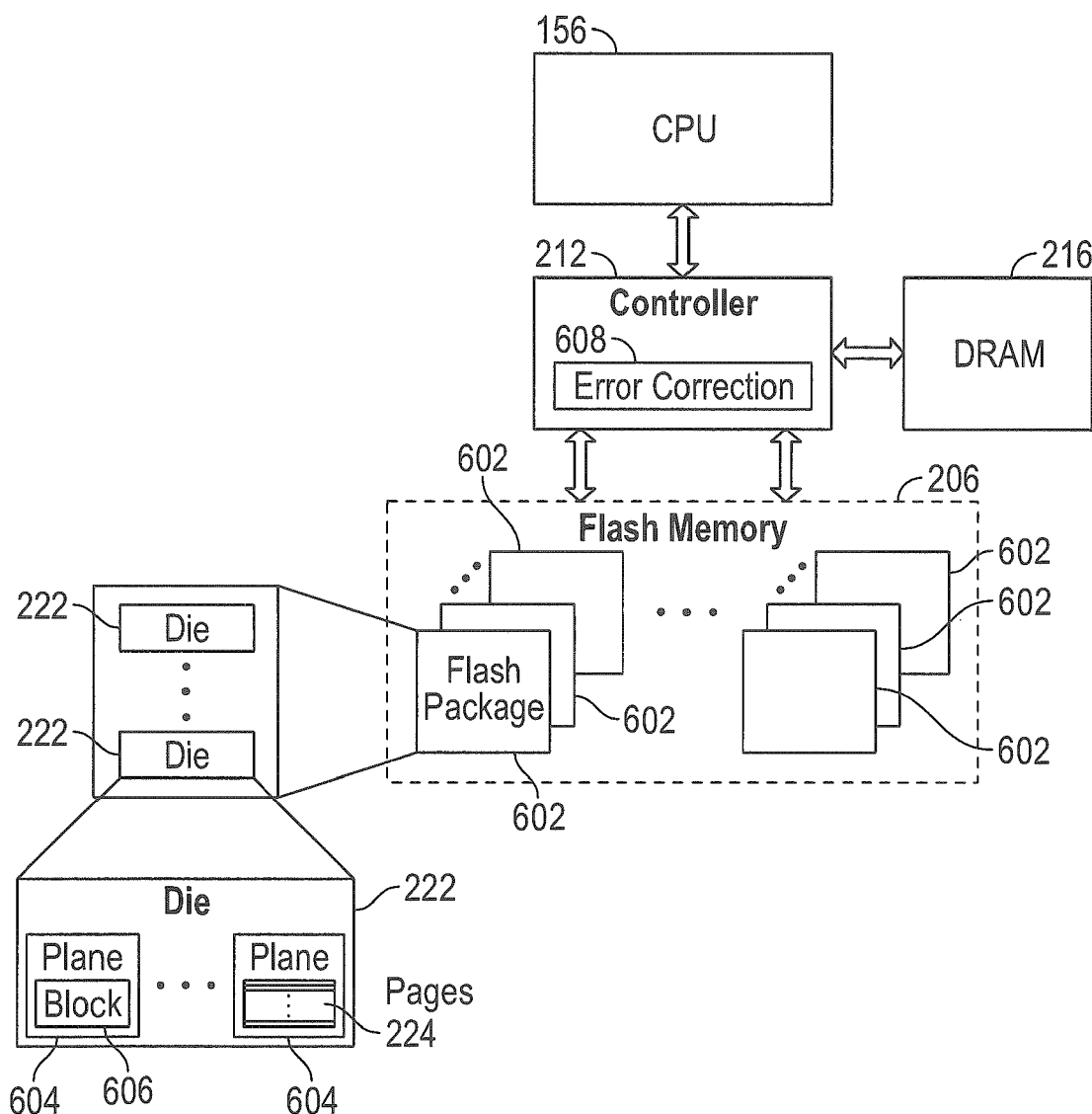
FIG. 6 is a multiple level block diagram, showing a controller, flash dies, and interior details of flash dies in accordance with some embodiments.

FIG. 6 is a multiple level block diagram, showing a controller 212, flash dies 222, and interior details of flash dies 222. Diagnostic information relating to the flash memory 206 can be obtained on a per flash package 602, per flash die 222, per flash plane 604, per flash block 606, and/or per flash page 224 basis across the entirety of a storage cluster 160, in some embodiments. In the example shown in FIG. 6, the flash memory 206 includes multiple flash packages 602. Each flash package 602 includes multiple flash dies 222, each of which in turn includes multiple flash planes 604. Each flash plane 604 includes multiple flash blocks 606 each of which in turn includes multiple flash pages 224. The diagnostic information is gathered or generated by the controller 212 of each non-volatile solid-state storage unit and forwarded to the CPU 156 of the corresponding storage node. In some embodiments, the CPU 156 performs further analysis on the diagnostic information and generates further diagnostic information. The controller 212 and/or the CPU 156 can write the diagnostic information to a memory in the storage cluster, for example the flash memory 206 or the DRAM 216 of a non-volatile solid-state storage unit, the memory 154 (See FIG. 1) coupled to the CPU 156 in a storage node, or other memory of the storage cluster, storage node, or non-volatile solid-state storage unit. The diagnostic information can be stored as metadata, in some embodiments.

One type of diagnostic information is obtained by tracking bit errors per flash page 224 or per codeword. Each flash page 224 has multiple codewords, in some embodiments. Incidents of error correction could be reported and these incidents may be used as a source on which to base the diagnostic information. For example, the controller 212 could track bit errors of the flash memory 206 and forward the information about the bit errors to the CPU 156, which could then tabulate this and/or generate further diagnostic information. Bit errors, or error corrections, can be tracked from feedback from an error correction block 608 in the controller 212 in some embodiments. The CPU 156 or the controller 212 could track wear of flash blocks 606 in the flash memory 206, e.g., by establishing and updating a wear list in memory coupled as described above, responsive to or based on some of the diagnostic information. Such tracking could include ranking flash blocks 606 as to levels of wear, or comparing flash blocks 606 as to levels of wear. The flash memory 206 can be characterized over time, based on the diagnostic information. Characterization information could indicate changes or trends in the flash memory 206, such as increases in the rate of errors or error correction over time. This characterization can be performed at any of the levels of granularity discussed above.

In some embodiments, the characterization or diagnostic information combines lower-level information from the flash memory 206 itself, such as bit error rates or types of errors (e.g. a zero is read as a one or a one is read as a zero), with higher-level application data. The higher-level application data could include retention time (e.g. how long a particular piece of data has been in the flash memory 206), file type, frequencies or relative arrival times of updates, erases or writes for specific files or other pieces of data, inter-arrival times, performance metrics, cacheability, etc. For example, the wear list expresses wear per flash package 602, die 222, block 606 or other portion of flash memory 206, in terms of age, number of reads, number of writes, number of erasure cycles, and/or other parameters. In some embodiments, a retention list is established and maintained, which tracks how old data is in a particular flash package 602, die 222, block 606 or other portion of flash memory, i.e., how long the data has resided since it was last written. Either of these metrics, or a combination of these or other metrics, could be used to characterize the flash memory. Temperature, in a temperature list or table, could also be used. Various further tables and categories for characterizing flash could be added. In this manner, monitoring of the flash memory 206 is combined across multiple dimensions of flash and system metrics. Results of the monitoring can be indexed into a table or other data structure, in order to determine changes to flash settings for specific portions of the flash memory 206 to optimize reads, writes or erases (e.g., to an address range). This is in contrast to standard solid-state drives, which do not have access to die-level monitoring, and cannot make adjustments to that level of granularity.

In some embodiments, the CPU 156 sends the diagnostic information, or summarizes the diagnostic information in a report and sends the report, via a network. The diagnostic information or the report could be sent to an appropriate person or organization, which could include an owner or operator of a storage cluster, a manufacturer of storage nodes, a manufacturer of flash memory 206, flash packages 602 or flash dies 222 or other interested or authorized party. These reports could benefit the manufacturers, which can use the information for warranty service and/or to highlight manufacturing and reliability problems and guide improvements. The reports also benefit users, who can plan system maintenance, repairs and upgrades based on the details in the reports. Actual behavior of the flash memory 206 over time can be compared to predicted behavior or to warranties if applicable.

The CPU 156 or the controller 212 could make decisions based on the diagnostic information. For example, if it is determined that a flash block 606 has a high level of wear, the CPU 156 or the controller 212 could determine to write some of the user data to another flash block 606 with a lower level of wear. The controller 212 may bias a read from the flash memory, or a write to the flash memory 206, as a response to producing or obtaining the diagnostic information. Depending on the type of flash, and whether specific features are available on flash dies 222, this biasing can take different forms. Biasing the writes or the reads may extend the lifespan of some or all of the flash memory 206. For example, some types of flash dies 222 may support a variable write time, a variable write voltage, a variable read time, a variable reference voltage, a variable reference current or a variable number of reads. The controller 212 could determine, based on the diagnostic information, to direct a flash die 222 to apply a specified value of one of the above variable parameters to a specified write or read. The specified value could be applied to specified writes or reads to flash pages 224, flash blocks 606, flash dies 222, and/or flash packages 602. The controller 212 could determine to apply a stronger error correction code for a particular flash page 224 or flash block 606, or apply a different program and/or read mechanism to adjust for particular conditions such as high error rate, long retention time, and various combinations, etc. Thus, the granularity of the application of variable parameters to writes or reads of the flash memory 206 can match and be supported by the granularity of the diagnostic information itself.

The flash memory is a multi-dimensional space where sampling and extrapolation can be used. Data points that are close to sampling points for various dimensions (location, retention time, file type, etc.) can be used to predict what the ideal parameter settings should be for that operation, e.g., read, write, erase, etc. Predictions (based on matches and/or data extrapolation) are a type of use of the diagnostic information or system telemetry. In some embodiments, the controller 212 samples the reads or the writes of a particular flash page 224, flash block 606, flash die 222 or flash package 602, determines diagnostic information, extrapolates, determines a parameter setting, and applies that parameter setting for an extrapolated region or space.

Continuing with the above examples, the variable parameters are applicable to multiple scenarios. In a case where a flash block 606 is experiencing an increase in read errors, the controller 212 could direct the flash block 606 to perform repeated reads at differing reference voltages or reference currents. If a variable reference voltage or a reference current is not available, the controller 212 could perform the multiple reads without varying the reference voltage or current. The controller 212, or the CPU 156 could then perform statistical analysis of the reads and determine a most likely bit value for each read of data in the flash block 606. In cases where a variable write parameter is supported in flash dies 222, a value of a variable write parameter can be selected in an attempt to increase write or read reliability of the flash die 222. Similarly, in cases where a variable read parameter is supported in flash dies 222, a value of a variable read parameter can be selected in an attempt to increase read reliability of the flash die 222. In some embodiments a value for a variable write or read parameter could be selected in response to a determination that some portion of flash memory 206 has greater wear relative to another portion. As a further example, some types of flash dies 222 may have and support changing from multilevel cell (MLC) operation to single cell (SLC) operation. SLC flash has one bit per cell, and MLC flash has more than one bit per cell. Examples of MLC flash include two bits per cell for four levels, three bits per cell (also known as triple level cell or TLC) for eight levels, four bits per cell (also known as quad level cell or QLC) and so on. The CPU 156 or the controller 212 could direct a flash die 222 to change from MLC operation to SLC operation in order to increase reliability of reads or writes. This change may be in response to determining that some portion of the flash memory 206 has greater wear relative to another portion.

Figure 7:
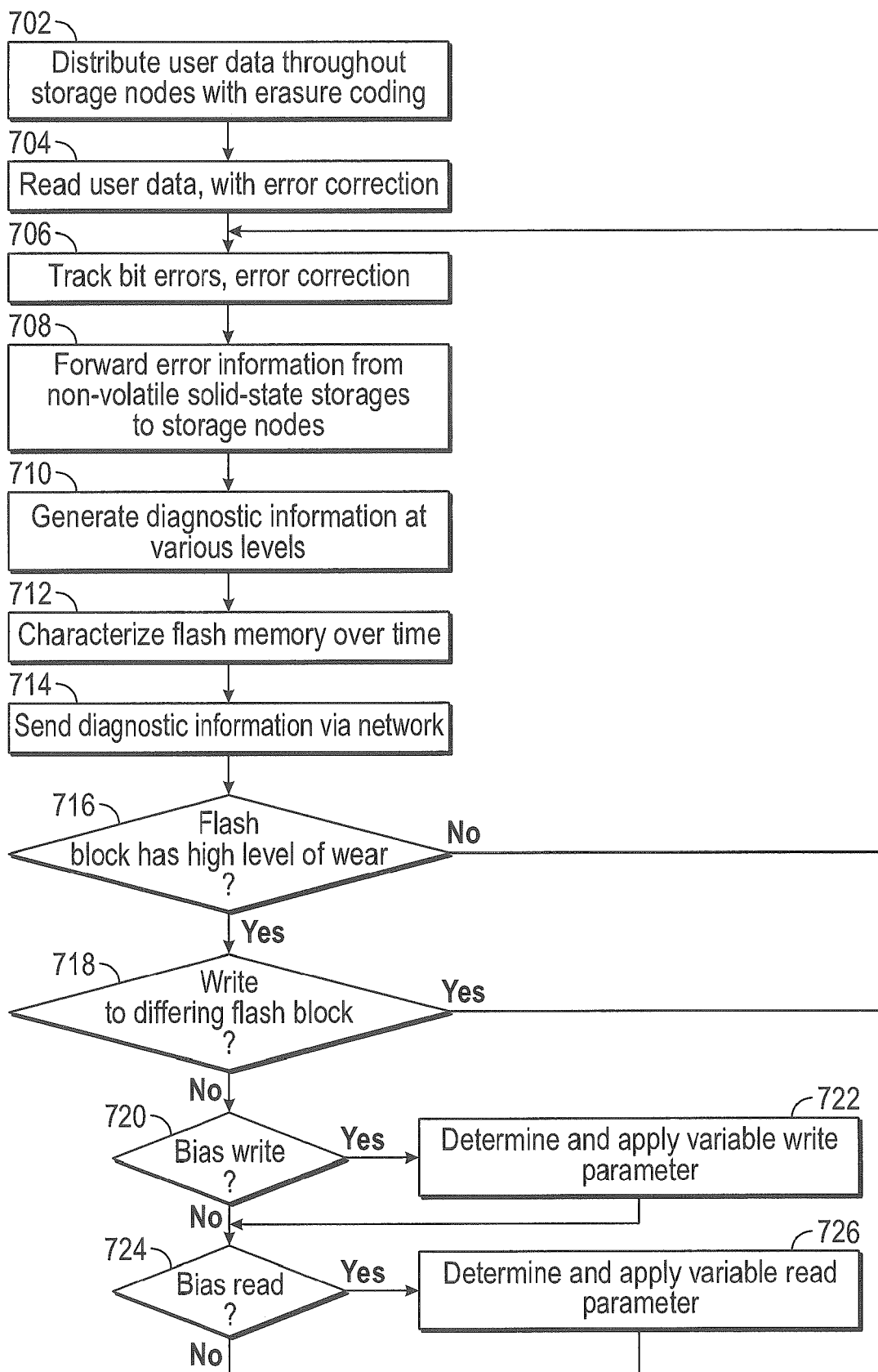
FIG. 7 is a flow diagram of a method for die-level monitoring in a storage array, which can be practiced on or by embodiments of the storage cluster, storage nodes and/or non-volatile solid-state storages in accordance with some embodiments.

FIG. 7 is a flow diagram of a method for die-level monitoring in a storage array, which can be practiced on or by embodiments of the storage cluster, storage nodes and/or non-volatile solid-state storages in accordance with some embodiments. Actions of the method can be performed by a processor, such as the CPU of a storage node or the controller of a non-volatile solid-state storage. User data is distributed throughout a plurality of storage nodes, with erasure coding, in an action 702. The user data is accessible via the erasure coding, even if two of the storage nodes become unreachable. User data is read, with error correction as applicable, in an action 704. Bit errors and/or error correction incidents are tracked, in an action 706. Error information is forwarded from non-volatile solid-state storages to storage nodes, in an action 708.

Continuing with FIG. 7, diagnostic information is generated at various levels, in an action 710. For example, the diagnostic information could be generated at the level of the flash package, flash die, flash plane, flash block, or flash page. The flash memory is characterized over time, in an action 712. This characterization could be performed at any or all of the above levels. The diagnostic information is sent to an appropriate destination possibly via a network, in an action 714. In a decision action 716, it is determined whether a flash block has a high level of wear. This determination is based on the diagnostic information. If the answer is no, flow branches back to the action 706, to continue tracking bit errors or error correction. If the answer is yes, a flash block does have a high level of wear, flow proceeds to the decision action 718. In the decision action 718, it is determined whether to write to a differing flash block. If the answer is yes, the writing should be to a differing flash block, flow branches back to the action 706, to continue tracking bit errors or error correction. If the answer is no, the writing should be to the block that has the high level of wear, flow proceeds to the decision action 720.

In the decision action 720, it is determined whether to bias a write. If the answer is no, flow proceeds to the decision action 724. If the answer is yes, flow proceeds to the action 722 where a variable write parameter is determined and applied. In the decision action 724, is determined whether to bias a read. If the answer is no, flow proceeds back to the action 706, to continue tracking bit errors or error correction. If the answer is yes, flow proceeds to the action 726. In the action 726, a variable read parameter is determined and applied. Flow then proceeds back to the action 706, to continue tracking bit errors or error correction. In variations of the above method, the determinations of whether to bias a write or a read could be made in differing orders, or could be based on other aspects of diagnostic information. Diagnostic information could be stored in various memory locations in a storage cluster.

Figure 8:
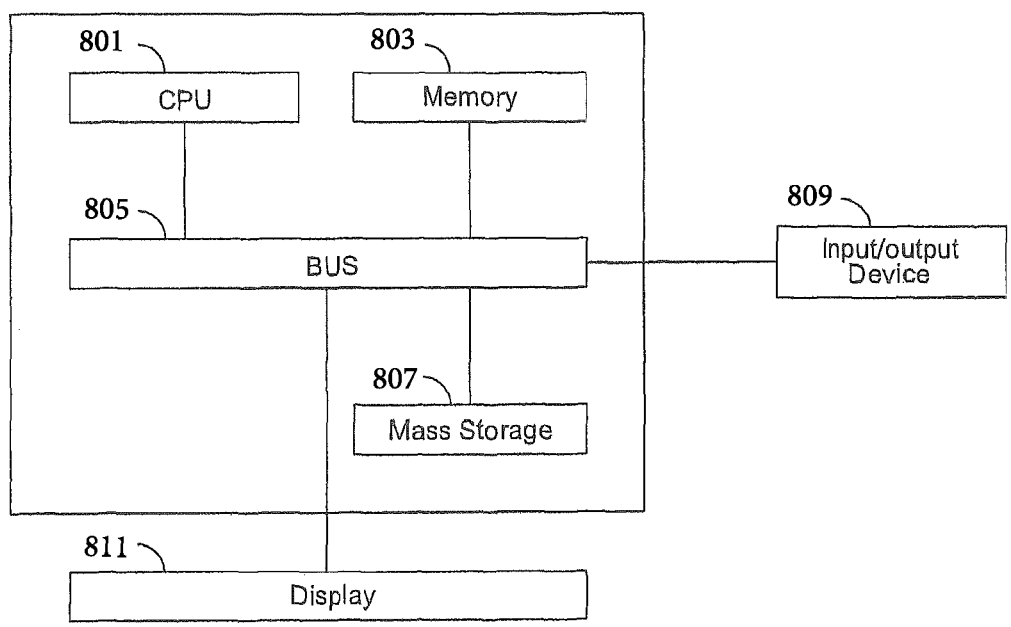
FIG. 8 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 8 is an illustration showing an exemplary computing device which may implement the embodiments described herein. The computing device of FIG. 8 may be used to perform embodiments of the functionality for a storage node or a non-volatile solid-state storage in accordance with some embodiments. The computing device includes a central processing unit (CPU) 801, which is coupled through a bus 805 to a memory 803, and mass storage device 807. Mass storage device 807 represents a persistent data storage device such as a disc drive, which may be local or remote in some embodiments. The mass storage device 807 could implement a backup storage, in some embodiments. Memory 803 may include read only memory, random access memory, etc. Applications resident on the computing device may be stored on or accessed via a computer readable medium such as memory 803 or mass storage device 807 in some embodiments. Applications may also be in the form of modulated electronic signals modulated accessed via a network modem or other network interface of the computing device. It should be appreciated that CPU 801 may be embodied in a general-purpose processor, a special purpose processor, or a specially programmed logic device in some embodiments.

Display 811 is in communication with CPU 801, memory 803, and mass storage device 807, through bus 805. Display 811 is configured to display any visualization tools or reports associated with the system described herein. Input/output device 809 is coupled to bus 505 in order to communicate information in command selections to CPU 801. It should be appreciated that data to and from external devices may be communicated through the input/output device 809. CPU 801 can be defined to execute the functionality described herein to enable the functionality described with reference to FIGS. 1-7. The code embodying this functionality may be stored within memory 803 or mass storage device 807 for execution by a processor such as CPU 801 in some embodiments. The operating system on the computing device may be MS-WINDOWS™, UNIX™, LINUX™, iOS™, CentOS™, Android™, Redhat Linux™, z/OS™, or other known operating systems. It should be appreciated that the embodiments described herein may be integrated with virtualized computing system also.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A plurality of storage nodes, comprising:
   each of the plurality of storage nodes having non-volatile solid-state storage; and
   each non-volatile solid-state storage having a controller configured to track bit errors of solid-state memory in the non-volatile solid-state storage, wherein diagnostic information for each non-volatile solid-state storage is based at least in part on the bit errors.

2. The plurality of storage nodes of claim 1, further comprising
   the plurality of storage nodes configured to derive characterization information from the diagnostic information, the characterization information indicating at least one change, prediction or trend in the non-volatile solid-state storage.

3. The plurality of storage nodes of claim 1, further comprising
   the plurality of storage nodes configured to report the diagnostic information via a network.

4. The plurality of storage nodes of claim 1, further comprising non-volatile memory included in the non-volatile solid-state storage;

each non-volatile solid-state storage having a controller, the controller configured to track bit errors of the non-volatile memory;

each of the plurality of storage nodes having a processor, and the controller of each non-volatile solid-state storage configured to forward information regarding the bit errors to each processor.

5. The plurality of storage nodes of claim 1, further comprising:

each of the plurality of storage nodes configured to direct a portion of non-volatile memory of non-volatile solid-state storage to change one of: a variable write time, a variable write voltage, a variable read time, a variable reference voltage, a variable reference current, or a variable number of reads, based on the diagnostic information.

6. The plurality of storage nodes of claim 1, further comprising:

a wear list, coupled to the plurality of storage nodes and configured to categorize blocks of the non-volatile solid-state storage by wear level;

a retention list, coupled to the plurality of storage nodes and configured to track data retention in the non-volatile solid-state storage; and the plurality of storage nodes configured to update the wear list responsive to the diagnostic information.

7. A storage cluster, comprising a plurality of storage nodes within a chassis;

each of the plurality of storage nodes having a controller with an error correction block, wherein diagnostic information is based on a result of feedback from the error correction block.

8. The storage cluster of claim 7, further comprising:

each of the plurality of storage nodes having a controller with an error correction block configured to perform error correction on a data stripe that includes reads of non-volatile memory across the plurality of storage nodes, wherein the diagnostic information is based on feedback from the error correction block of each of the plurality of storage nodes.

9. The storage cluster of claim 7, further comprising:

each of the plurality of storage nodes configured to determine relative wear of blocks; and each of the plurality of storage nodes configured to direct a write to a second block, based on a determination that the second block has a lower wear than a first block according to the diagnostic information.

10. The storage cluster of claim 7, further comprising:

each of the plurality of storage nodes configured to direct a portion of non-volatile memory to change a read reference voltage or a read reference current, responsive to a determination that the portion of the non-volatile memory has one of a greater wear, a greater retention time, a greater read time, or a greater write time, than a further portion of the non-volatile memory according to the diagnostic information.

11. The storage cluster of claim 7, further comprising:

each of the plurality of storage nodes configured to direct a portion of non-volatile memory to change from multilevel cell (MLC) operation to single level cell (SLC) operation, responsive to a determination that the portion of the non-volatile memory has a greater wear than a further portion of the non-volatile memory according to the diagnostic information.

12. The storage cluster of claim 7, further comprising:

the plurality of storage nodes configured to track trends or changes of non-volatile memory based on the diagnostic information; and the plurality of storage nodes configured to derive characterization information from the diagnostic information pertaining to the non-volatile memory, and from one of application data or meta data, pertaining to the user data.

\* \* \* \* \*